(12) United States Patent
Hu et al.

(10) Patent No.: US 12,034,268 B2
(45) Date of Patent: Jul. 9, 2024

(54) OPTICAL PHASE LOCKED LOOPS FOR GENERATING HIGHLY-LINEAR FREQUENCY CHIRPS

(71) Applicant: JASR Systems, LLC, Solana Beach, CA (US)

(72) Inventors: Tianyi Hu, San Diego, CA (US); Jinendra S. Ranka, San Diego, CA (US); Christopher S. Sexton, San Diego, CA (US); Brett A. Spivey, Carlsbad, CA (US); Kyle D Watson, Carlsbad, CA (US)

(73) Assignee: JASR Systems, LLC, Solana Beach, CA (US)

( * ) Notice: Subject to any disclaimer, the term of this patent is extended or adjusted under 35 U.S.C. 154(b) by 719 days.

(21) Appl. No.: 17/232,492

(22) Filed: Apr. 16, 2021

(65) Prior Publication Data

US 2021/0328402 A1 Oct. 21, 2021

Related U.S. Application Data

(60) Provisional application No. 63/011,497, filed on Apr. 17, 2020.

(51) Int. Cl.
| | |
|---|---|
| *H01S 5/12* | (2021.01) |
| *G01B 9/02003* | (2022.01) |
| *G01B 9/02015* | (2022.01) |
| *G01B 9/02055* | (2022.01) |
| *G01S 7/4911* | (2020.01) |
| *H01S 3/00* | (2006.01) |
| *H01S 3/13* | (2006.01) |

(Continued)

(52) U.S. Cl.
CPC ........ *H01S 3/1307* (2013.01); *G01B 9/02003* (2013.01); *G01B 9/02029* (2013.01); *G01B 9/02072* (2013.04); *G01S 7/4911* (2013.01); *H01S 3/0014* (2013.01); *H01S 3/1305* (2013.01); *H01S 5/0264* (2013.01); *H01S 5/1246* (2013.01); *H01S 5/4012* (2013.01)

(58) Field of Classification Search
CPC .... H01S 3/1307; H01S 3/1305; H01S 5/0264; H01S 5/1246; H01S 5/4012; G01B 9/02003; G01B 9/02029; G01B 9/02072; G01S 7/4911
See application file for complete search history.

(56) References Cited

U.S. PATENT DOCUMENTS

| | | | | |
|---|---|---|---|---|
| 2003/0185255 | A1* | 10/2003 | Ye | .......................... H01S 3/2383 |
| | | | | 372/18 |
| 2009/0103100 | A1* | 4/2009 | Froggatt | .............. G01M 11/083 |
| | | | | 356/477 |
| 2009/0296751 | A1* | 12/2009 | Kewitsch | ................ H01S 5/042 |
| | | | | 372/18 |

* cited by examiner

*Primary Examiner* — Yuanda Zhang
(74) *Attorney, Agent, or Firm* — Clements Bernard Walker; Christopher L. Bernard

(57) ABSTRACT

Various disclosed embodiments provide illustrative interferometers, optical phase locked loops, laser systems, interferometry methods, and phase locked loop methods. In illustrative embodiments, light from a laser is split into a first arm and a second arm. Light in an arm chosen from the first arm and the second arm is time delayed. The light in the first arm is split into third, fourth, and fifth arms. The light in the second arm is split into sixth, seventh, and eighth arms. Light in the seventh and eighth arms is phase shifted relative to light in the sixth arm. Light in the third, fourth, and fifth arms is combined with light in the sixth arm and phase shifted light in the seventh and eighth arms, respectively. A frequency correction signal for the laser is generated.

43 Claims, 17 Drawing Sheets

(51) Int. Cl.
*H01S 5/026* (2006.01)
*H01S 5/40* (2006.01)

_OPTICAL PHASE LOCKED LOOPS FOR GENERATING HIGHLY-LINEAR FREQUENCY CHIRPS_

TECHNICAL FIELD

The present disclosure relates to optical phase locked loops.

BACKGROUND

The statements in this section merely provide background information related to the present disclosure and may not constitute prior art.

An optical phase locked loop ("PLL") locks a laser—that is, determines and stabilizes the wavelength of the laser. Traditional optical PLLs are based on a phase-sensitive, two-arm interferometer. Light from a laser is split into two arms. A time delay is inserted in one of the two arms, and light from the two arms is combined. The light from the two arms interfere with each other and produce a beat tone. The beat tone is measured, and the measured beat tone is compared to a reference frequency. An error signal is generated and is fed back to the laser. In applications in which frequency of the laser is modulated (or swept), locking the laser can linearize frequency sweep.

Referring to FIG. 1, one arm of an interferometer is measured and a high-pass filter removes direct current (DC) terms ($a^2+b^2$) to acquire the beat term $\cos(k\Delta L)$ in an example of a conventional optical PLL setup. This process entails a long delay or a long integration time to isolate the beat term with high-precision, low-frequency phase errors. As a result, PLLs are backwards looking, using old data to correct the current phase error. If the phase errors are changing rapidly, then the PLL will become unstable. In systems where long path delays are not possible (such as, for example, silicon photonics), long integration time may be the only option and may not produce high frequency corrections. For applications where accurate phase stability is required, these correction errors can lead to significant performance degradation.

Frequency-Modulated Continuous Wave (FMCW) is a form of a radar/lidar sensor in which the radar operating frequency is modulated with a periodic waveform during the measurement. A PLL is required to ensure that the generated modulation accurately follows the desired modulation pattern. The basic pattern is a linear chirp (that is, a linear change in frequency over time) that is repeated. The linearity of the chirp is important as to not blur the system resolution. Referring to FIG. 2A, the time reference for measuring the distance to a target object is determined by measuring the frequency shift between the transmitted and received signals. For moving targets and referring to FIG. 2B, the radial velocity can be extracted when using a linearly-chirped triangular modulation function as the waveform.

This technique, however, requires a highly linear chirp waveform. Any distortion will cause the detected beat tones, $f_{beat\_up}$ and $f_{beat\_down}$, to vary during the measurement. This results in a spectral broadening of the measured signal from a single target to be spread across multiple range bins. This spectral broadening reduces the ranges/velocity resolution and impacts the signal-to-noise ratio (SNR), thereby making detecting weak signals at long range problematic. The effect is dependent on the time of flight, so the degradation becomes more prominent as the range to target increases.

If $$f_{transmit} = f_0 + \beta_0 t + \beta_1 t^2 +$$

where $\beta_0$ is the desired linear chirp, and $\beta_1, \beta_2 \ldots$ are the nonlinear distortion terms, then the beat tone from a fixed target at distance R will have the terms $$f_{beat} = f_{transmit} - f_{receive} = \beta_0(2R/c) + \beta_1\left(t^2 - \left(t - \frac{2R}{c}\right)^2\right) + \ldots$$

The impact of the spectral distortion terms $\beta_1, \ldots, \beta_i$ increases as range (R) to the $i^{th}$ power. The distortion terms results in blurring of the system resolution as well as requiring increased laser power.

Current techniques to generate highly linear frequency chirps typically rely on components external to a laser cavity that can be characterized or calibrated to generate the required chirp waveform. Techniques that modulate the frequency of the laser directly, either by changing the gain medium characteristics, such as by current modulating a laser diode, or by modulating the cavity length, are difficult to control and can lead to nonlinear distortions in the modulated waveform.

Referring to FIG. 3, as discussed above current techniques use a two-arm phase measurement. For a two-arm measurement, if the interferometer can be perfectly balanced, then the phase, modulo $\pi$—that is, a phase that repeats every $\pi$—can be measured by measuring the ratio I/Q (that is, ratio of amplitude to phase offset), and the error can be calculated by comparing to the expected value.

$$I/Q = \tan(k\Delta L/2)^2,$$

$$\text{Phase Error} = \tan^{-1}\left(\sqrt{I/Q}\right) - \text{expected value}.$$

This measurement entails the arms of the interferometer to be balanced and detector sensitivity to be calibrated over the full operating wavelength span and temperature to compensate for the modulo $\pi$ uncertainty.

SUMMARY

Various disclosed embodiments provide illustrative interferometers, optical phase locked loops, laser systems, interferometry methods, and phase locked loop methods.

In an illustrative embodiment, an interferometer includes a first optical splitter configured to split light from a laser into a first arm and a second arm. A delay line is configured to time delay light in an arm chosen from the first arm and the second arm. A second optical splitter is configured to split the light in the first arm into third, fourth, and fifth arms. A third optical splitter is configured to split the light in the second arm into sixth, seventh, and eighth arms. A first phase shifter is configured to phase shift light in the seventh arm relative to light in the sixth arm. A second phase shifter is configured to phase shift light in the eighth arm relative to light in the sixth arm. A first combiner is configured to combine light in the third arm with light in the sixth arm. A second combiner is configured to combine light in the fourth arm with phase shifted light in the seventh arm. A third combiner is configured to combine light in the fifth arm with phase shifted light in the eighth arm.

In another illustrative embodiment, an optical phase locked loop includes a first optical splitter configured to split light from a laser into a first arm and a second arm. A delay line is configured to time delay light in an arm chosen from the first arm and the second arm. A second optical splitter is configured to split the light in the first arm into third, fourth, and fifth arms. A third optical splitter is configured to split the light in the second arm into sixth, seventh, and eighth arms. A first phase shifter is configured to phase shift light in the seventh arm relative to light in the sixth arm. A second phase shifter is configured to phase shift light in the eighth arm relative to light in the sixth arm. A first combiner is configured to combine light in the third arm with light in the sixth arm. A second combiner is configured to combine light in the fourth arm with phase shifted light in the seventh arm. A third combiner is configured to combine light in the fifth arm with phase shifted light in the eighth arm. A first detector is configured to detect a first analog electrical signal from light from the first combiner. A second detector is configured to detect a second analog electrical signal from light from the second combiner. A third detector is configured to detect a third analog electrical signal from light from the first combiner. A processor is configured to generate a frequency correction signal for the laser responsive to the first, second, and third analog electrical signals.

In another illustrative embodiment, a laser system includes a laser, a power tap configured to split light from the laser into an output arm and a lock arm, and a phase locked loop. The phase locked loop includes a first optical splitter configured to split light from the lock arm into a first arm and a second arm. A delay line is configured to time delay light in an arm chosen from the first arm and the second arm. A second optical splitter is configured to split the light in the first arm into third, fourth, and fifth arms. A third optical splitter is configured to split the light in the second arm into sixth, seventh, and eighth arms. A first phase shifter is configured to phase shift light in the seventh arm relative to light in the sixth arm. A second phase shifter is configured to phase shift light in the eighth arm relative to light in the sixth arm. A first combiner is configured to combine light in the third arm with light in the sixth arm. A second combiner is configured to combine light in the fourth arm with phase shifted light in the seventh arm. A third combiner is configured to combine light in the fifth arm with phase shifted light in the eighth arm. A first detector is configured to detect a first analog electrical signal from light from the first combiner. A second detector is configured to detect a second analog electrical signal from light from the second combiner. A third detector is configured to detect a third analog electrical signal from light from the first combiner. A processor is configured to generate a frequency correction signal for the laser responsive to the first, second, and third analog electrical signals.

In another illustrative embodiment, an interferometry method includes: splitting light from a laser into a first arm and a second arm; time delaying light in an arm chosen from the first arm and the second arm; splitting the light in the first arm into third, fourth, and fifth arms; splitting the light in the second arm into sixth, seventh, and eighth arms; phase shifting light in the seventh and eighth arms relative to light in the sixth arm; and combining light in the third, fourth, and fifth arms with light in the sixth arm and phase shifted light in the seventh and eighth arms, respectively.

In another illustrative method, a phase locked loop method includes: splitting light from a laser into a first arm and a second arm; time delaying light in an arm chosen from the first arm and the second arm; splitting the light in the first arm into third, fourth, and fifth arms; splitting the light in the second arm into sixth, seventh, and eighth arms; phase shifting light in the seventh and eighth arms relative to light in the sixth arm; combining light in the third, fourth, and fifth arms with light in the sixth arm and phase shifted light in the seventh and eighth arms, respectively; and generating a frequency correction signal for the laser.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Illustrative embodiments are illustrated in referenced figures of the drawings. It is intended that the embodiments and figures disclosed herein are to be considered illustrative rather than restrictive.

DETAILED DESCRIPTION

The following description is merely illustrative in nature and is not intended to limit the present disclosure, application, or uses.

As will be discussed in further detail below, various disclosed embodiments provide optical phase locked loops for determining and stabilizing wavelength of a laser. In applications in which frequency of the laser is modulated (or swept), locking the laser can generate highly-linear frequency chirps, thereby linearizing frequency sweep. According to various aspects, various disclosed phased locked loops may be integrated into a laser system.

Figure 1:
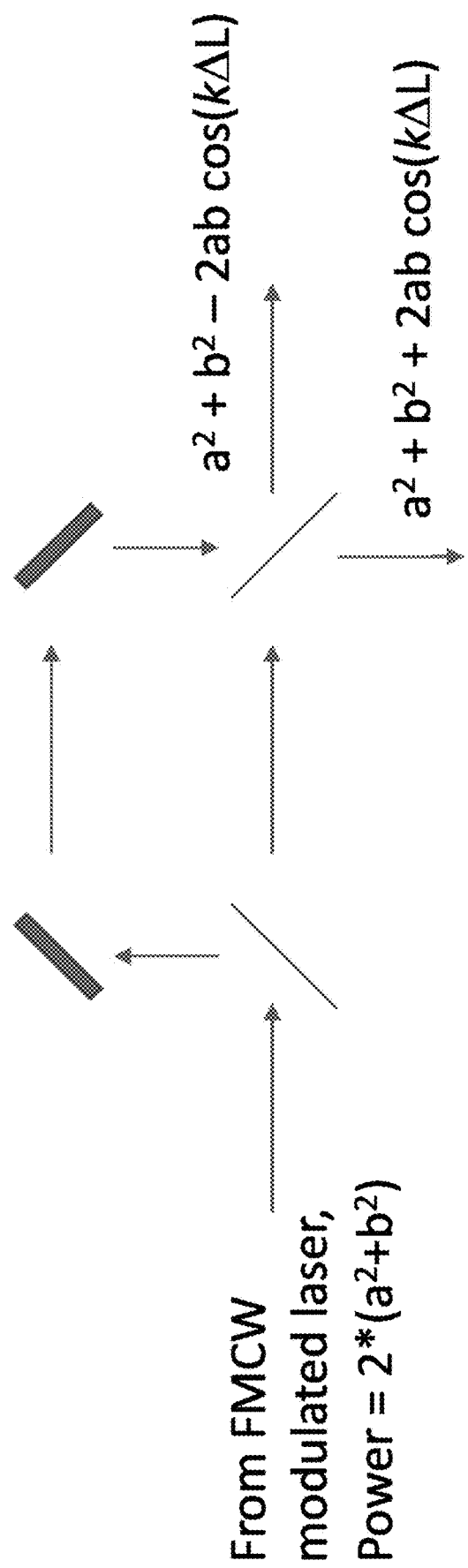
FIG. 1 is an illustration in schematic form of FMCW transmit and receive modulation for a linear chirp according to the prior art.
Figure 2B:
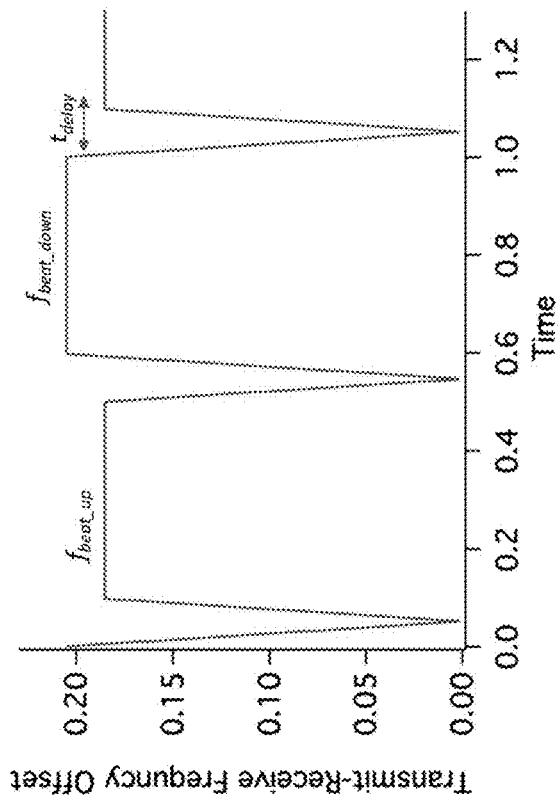
FIG. 2B is a graph of transmit-receive frequency offset versus time in an FMCW radar according to the prior art.
Figure 2A:
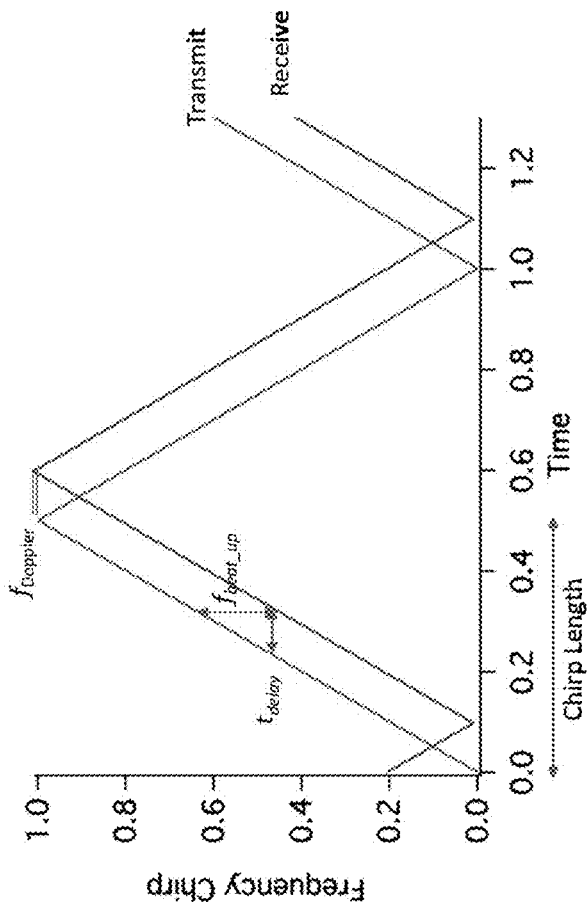
FIG. 2A is a graph of frequency shift between transmitted and received signals versus time in an FMCW radar according to the prior art.
Figure 4:
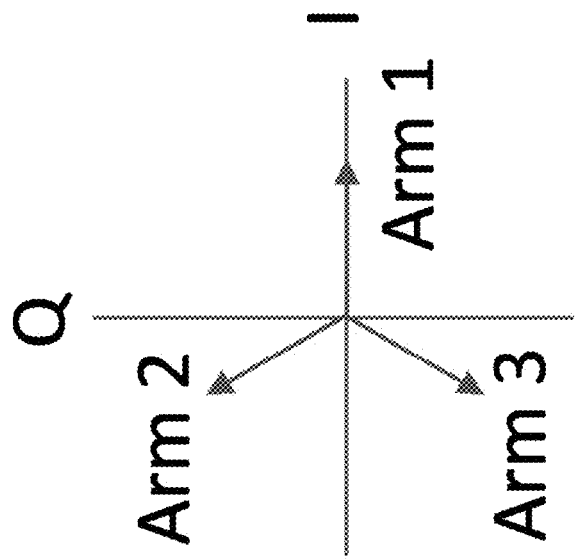
FIG. 4 is an illustrative three-arm I/Q measurement.
Figure 3:
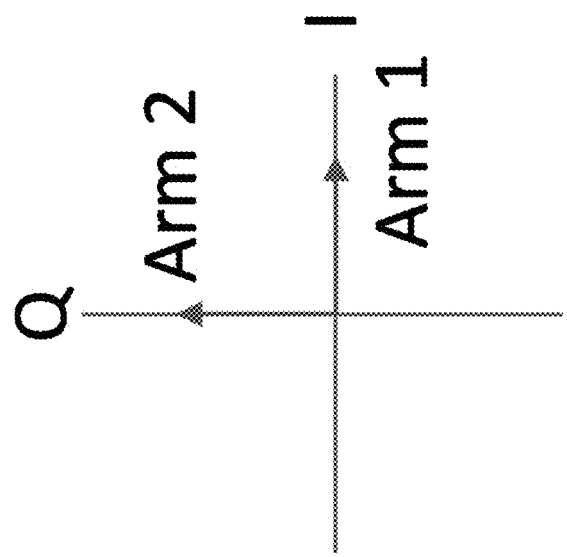
FIG. 3 is a two-arm I/Q measurement according to the prior art.

Referring now to FIG. 4 and by way of non-limiting overview, instead of using a two-arm I/Q phase measurement (as shown in FIG. 3), various embodiments provide a multi-arm interferometer that uses a three-arm I/Q measurement (FIG. 4) for a near real-time phase locked loop. It will be appreciated that disclosed measurement techniques can help provide accurate phase information across a 2π phase shift with greater stability than currently-known two-arm configurations. The additional measurement compared to the conventional two-arm interferometer allows for a phase measurement directly from an interferometer, thereby helping contribute to reducing the measurement sensitivity to fabrication errors, temperature, and dispersion. This additional measurement also helps allow for an instantaneous measurement for high frequency phase correction.

Still referring to FIG. 4, an illustrative three-arm interferometer has a 2π/3 phase shift between Arm 1 and Arm 2 and a 4π/3 phase shift between Arm 1 and Arm 3. The conjugated phase-shifted sum of the three arms (that is, Arm 1, Arm 2, and Arm 3) multiplied by the conjugate of the desired signal directly yields the phase error.

Various disclosed embodiments can help provide approaches that may help provide nonlinear distortions with a small time delay (as opposed to a log time delay) and an ability to measure and correct for phase errors, thereby helping to determine and stabilize wavelength of a laser.

Figure 5:
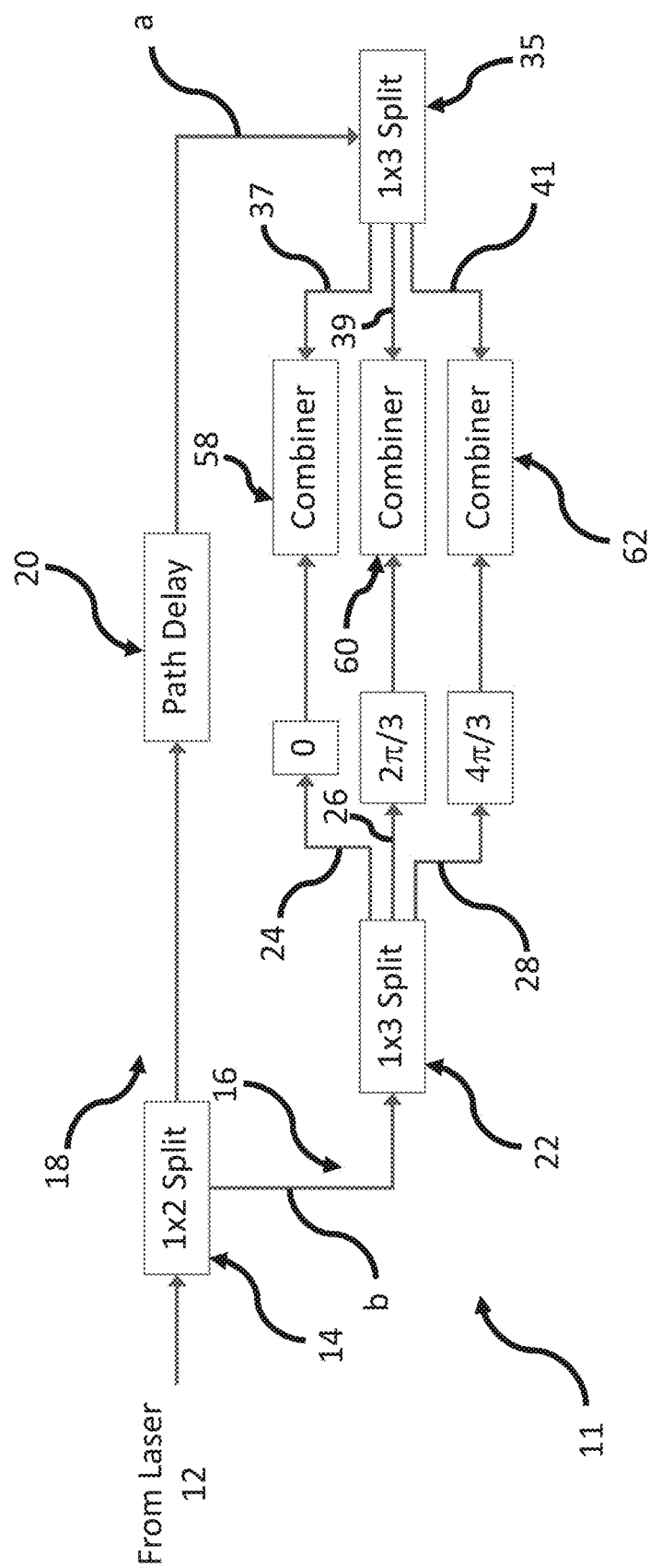
FIG. 5 is a block diagram of an illustrative three-arm interferometer.

Referring additionally to FIG. 5 and given by way of overview, in various embodiments an illustrative three-arm interferometer 11 can be used with an optical PLL to enable the PLL to determine and stabilize wavelength of a laser 12. Output of the laser 12 is split with a 1×2 splitter 14 into an arm 16 and an arm 18. A delay line 20 provides an optical path delay for light in one of the arms (either the arm 18 or the arm 16). As shown in FIG. 5, in some embodiments the arm 18 includes the delay line 20. Light from the delay line 20 is a complex signal a (discussed below) and light in the arm 16 from the splitter 14 is a complex signal b (discussed below). However, the delay line 20 need not be provided in the arm 18 but may be provided in either the arm 18 or the arm 16 as desired. To that end, in some other embodiments the arm 16 may include the delay line 20.

Light in the arm 16 is split with a 1×3 splitter 22 into three arms—an arm 24, an arm 26, and an arm 28. Each of the arms 24, 26, and 28 is phase offset by one-third of a wave relative to the others (that is, 0, λ/3, and 2λ/3 or 0, 2π/3, and 4π/3). The light in the path-delayed arm 18 is split with a 1×3 splitter 35 into three arms—an arm 37, an arm 39, and an arm 41. The light in the arm 24 is combined with and interferes with the light in the arm 37 in a combiner 58, the light in the arm 26 is combined with and interferes with the light in the arm 39 in a combiner 60, and the light in the arm 28 is combined with and interferes with the light in the arm 41 in a combiner 62. Illustrative details of components of the interferometer 11 and of an illustrative PLL will be provided below by way of non-limiting details.

Figure 6:
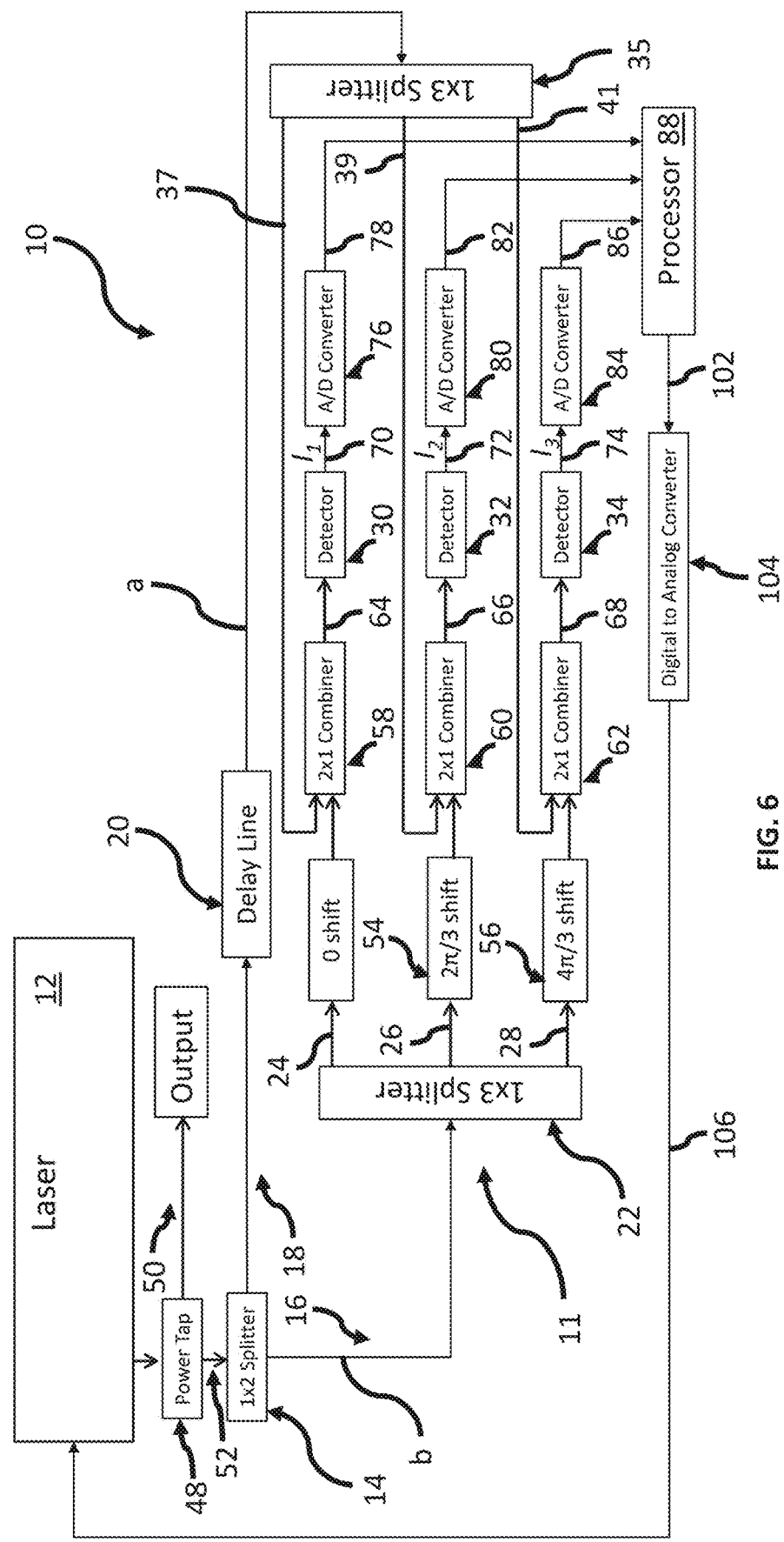
FIG. 6 is a detailed block diagram of an illustrative phase-correcting PLL with the three-arm interferometer of FIG. 5.

Referring additionally to FIG. 6, non-limiting details of an illustrative PLL 10 are given by way of illustration only and not of limitation. In various embodiments the PLL 10 can be used along with the laser 12 in any laser system for any variety of applications as desired, such as without limitation a light detection and ranging (LIDAR) system, an FMCW LIDAR system, other coherent imaging and sensing techniques, and the like. It will be appreciated that the PLL 10 and any associated desired laser system can be implemented using free-space and fiber-coupled optics as well as on a compact photonic integrated circuit platform (such as without limitation a silicon photonics indium phosphide platform or the like).

It will be appreciated that, in various embodiments, the laser 12 is not part of the PLL 10 but may be included with the PLL 10 in any suitable laser system for any variety of applications as desired. To that end, in various embodiments the laser 12 may include any suitable type of laser whatsoever as desired for a particular application, such as without limitation a chirped laser, a tunable laser, a distributed feedback (DFB) laser, an extended cavity diode laser (ECDL), a fiber laser, a high power (such as up to 500 mW or so) single mode DFB laser suitable for dense wavelength division multiplication (DWDM) networks, a laser diode suitable for FMCW LIDAR, and the like. It will be appreciated that, in various embodiments, the interferometer 11 and the PLL 12 may be used to coherently lock a second laser to a first laser, where the first laser serves as the reference. Regardless of type of laser, in various embodiments the laser 12 can be controlled by a feedback signal provided by the PLL 10 to the laser 12. For example and without limitation, the feedback signal may be a phase modulation signal for use by a phase modulator internal to the laser 12. As another example without limitation, the feedback signal may be a current modulation signal that adjusts or modulates the laser current.

In various embodiments and given by way of illustration only and not of limitation, the laser 12 may operate at a wavelength in the 1.5 micron telecommunication band and a power level of 1 to 500 mW. However, it will be appreciated that the laser 12 may operate at any wavelength (or frequency) and any power level as desired for a particular application. No limitation is intended and no such limitation should be inferred to any wavelength, frequency, power level range, and/or modulation scheme.

In various embodiments a power tap 48 is operatively couplable to an output of the laser 12 and is configured to split light output from the laser 12 into a path 50 and a path 52. In various embodiments, the power tap 48 may include a polarization-maintaining fiber optic splitter with an integrated optical isolator. In various embodiments, the power tap 48 is configured to split the light output from the laser 12 with a ratio selected to provide sufficient output light for the desired application and a sufficient amount of light for locking the laser 12 with the PLL 10. Given by way of illustration only and not of limitation, in various embodiments the power tap 48 may configured to split the light output from the laser 12 with a ratio of around thirty percent into the path 50 and around seventy percent into the path 52. It will be appreciated that this ratio is given as a non-limiting example only and depends on the particular laser used as the laser 12, the particular application for light output in the path 50, and the amount of light used for locking the laser 12 with the PLL 10. It will be appreciated that the power tap 48 may implement any ratio as desired for a particular application. No limitation is intended and no such limitation should be inferred regarding the ratio.

In various embodiments the power tap 48 provides the portion of light output from the laser 12 in the path 50 to any desired system whatsoever for a particular application, such as, without limitation, an FMCW laser radar, a laser amplifier, or any other system that uses output from the laser 12 as desired without any limitation at all.

In various embodiments the power tap 48 provides the portion of light output from the laser 12 in the path 52 (that is, the light output from the laser 12 that is not provided to the path 50) to the PLL 10 for determining and stabilizing wavelength of the laser 12. Light in the path 52 is provided to the 1×2 splitter 14. The splitter 14 splits the light in the path 52 into the arm 16 and the arm 18. In various embodiments the power of light provided to the arm 18 (with the delay line 20) has to account for losses in the delay line 20 as well as thermal heating and non-linear effects.

The splitter 14 suitably is any suitable beam splitter as desired, such as a beam splitter on a glass substrate, a tapered fiber splitter, a planar waveguide, or the like.

In various embodiments, light in the arm 18 is provided to the delay line 20. In various embodiments the delay line 20 introduces a time delay for light in the arm 18. As discussed above, the delay line 20 need not be provided in the arm 18 but may be provided in either the arm 18 or the arm 16 as desired. To that end, in some other embodiments the arm 16 may include the delay line 20.

In various embodiments the time delay suitably is sufficient for the control bandwidth to control the laser 12. Given by way of illustration only and not of limitation, in various embodiments a suitable time delay may range from picoseconds to nanoseconds. For example and without limitation, in some embodiments a suitable time delay may range from around 100 picoseconds to around 1 nanosecond. As another example and without imitation, in some embodiments a suitable time delay may nominally be around 600 picoseconds. It will be appreciated that the amount of time delay introduced by the delay line 20 is given by way of illustration only and not of limitation, and that any amount of time delay may be introduced by the delay line 20 as desired for a particular application.

The delay line 20 may be any suitable optical delay line as desired. For example and given by way of non-limiting examples, in various embodiments the delay line 20 may include a planar waveguide, an optical fiber delay line, or a free space delay line.

In various embodiments, the splitter 22 splits the light in the arm 16 into the arm 24, the arm 26, and the arm 28. In various embodiments the splitter 22 is configured to output light with substantially the same optical power in the arm 24, the arm 26, and the arm 28. The splitter 22 suitably is any suitable beam splitter as desired, such as those discussed above.

In various embodiments, light in each of the arms 24, 26, and 28 is phase offset by one-third of a wave relative to the others (that is, 0, $\lambda/3$, and $2\lambda/3$ or 0, $2\pi/3$, and $4\pi/3$). To that end, light in the arm 24 undergoes no phase shift (as indicated by "0 shift") and corresponds to Arm 1 shown in FIG. 4. Light in the arm 26 is phase shifted by one-third of a wave (that is, $\lambda/3$ or $2\pi/3$) relative to light in the arm 24 in an optical phase shifter 54 (as indicated by "$2\pi/3$") and corresponds to Arm 2 shown in FIG. 4. Light in the arm 28 is phase shifted by another one-third of a wave (that is, $2\lambda/3$ or $4\pi/3$) relative to light in the arm 24 in an optical phase shifter 56 (as indicated by "$2\pi/3$") and corresponds to Arm 3 shown in FIG. 4. The optical phase shifters 54 and 56 may be any suitable optical phase shifter as desired. For example and given by way of illustration only and not of limitation, in various embodiments the optical phase shifters 54 and 56 may include thermal or electro-optic based phase shifters.

In various embodiments, light from the delay line 20 is provided to the 1×3 splitter 35. The splitter 35 splits the light from the delay line 20 into the arm 37, the arm 39, and the arm 41. In various embodiments the splitter 35 is configured to output light with substantially the same optical power in the arm 37, the arm 39, and the arm 41. The splitter 35 suitably is any suitable beam splitter as desired, such as those discussed above.

In various embodiments, light from the arm 37 is mixed with light from the arm 24 using a 2×1 combiner 58 and produces a mixed optical signal 64. Similarly, light from the arm 39 is mixed with light from the arm 26 (with a $2\pi/3$ phase shift) using a 2×1 combiner 60 and produces a mixed optical signal 66, and light from arm the 41 is mixed with light from the arm 28 (with a $4\pi/3$ phase shift) using a 2×1 combiner 62 and produces a mixed optical signal 68. The combiner 58, the combiner 60, and the combiner 62 each may be any suitable optical combiner, such as without limitation a combiner on a glass substrate, a tapered fiber combiner, a planar waveguide-based combiner, or the like.

In various embodiments, the mixed optical signal 64 is converted to an analog electrical beat frequency signal 70 using a detector 30, the mixed optical signal 66 is converted to an analog electrical beat frequency signal 72 using a detector 32, and the mixed optical signal 68 is converted to an analog electrical beat frequency signal 74 using a detector 34. Given by way of non-limiting examples, the detectors 30, 32, 34 suitably may include any suitable detector, such as a photodiode or a high-speed photodetector, that converts light energy to electrical energy, such as without limitation an InGaAs photodiode, a silicon photodiode, or any other suitable photodiode.

In various embodiments, the analog beat frequency signal 70 is provided to an analog to digital converter 76 and is converted to a digital signal 78. Similarly, the analog beat frequency signal 72 is provided to an analog to digital converter 80 and is converted to a digital signal 82, and the analog beat frequency signal 74 is provided to an analog to digital converter 84 and is converted to a digital signal 86.

In various embodiments the digital signals 78, 82, and 86 are input to a processor 88. The processor 88 processes the signals 78, 82, and 86 as discussed below to create a feedback signal to control the laser 12.

In various embodiments the processor 88 suitably is any acceptable computer processor (also referred to as a central processing unit or a central processor). The processor 88 includes electronic circuitry that executes instructions that make up a computer program. The processor 88 performs basic arithmetic, logic, controlling, and input/output (I/O) operations specified by the instructions in the program.

Figure 7:
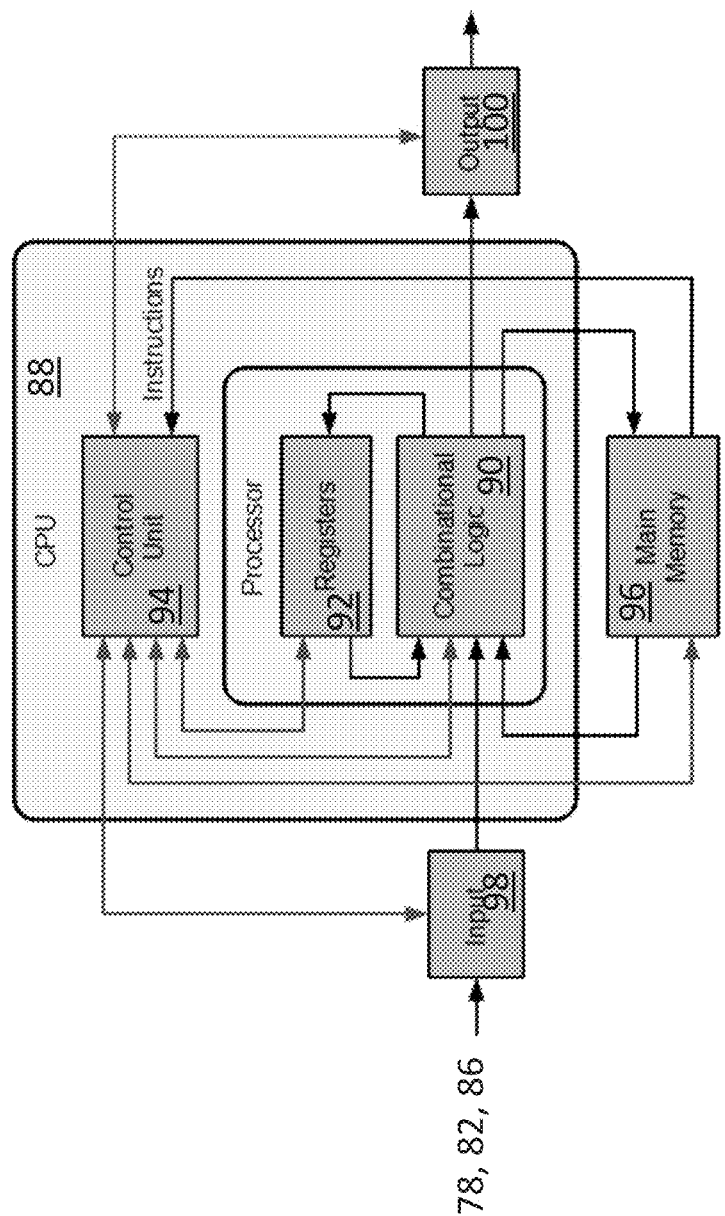
FIG. 7 is a block diagram of an illustrative processor.

Referring additionally to FIG. 7, the processor 88 includes combinational logic 90 (such as an arithmetic logic unit ("ALU") that performs arithmetic and logic operations, processor registers 92 that supply operands to the ALU and store the results of ALU operations, and a control unit 94 that orchestrates the fetching (from external memory 96) and execution of instructions by directing the coordinated operations of the combinational logic 90 (or ALU), the registers 92, and other components (such as an input device 98 and an output device 100).

In various embodiments the processor 88 processes the signals 78, 82, and 86 as described below to calculate an error between desired phase of the laser 12 and actual phase of the laser 12. The processor 88 outputs a digital signal 102. The digital signal 102 is input to a digital to analog converter 104 and is converted to an analog signal 106. The analog signal 106 is a feedback signal that is provided to the laser 12 to control the laser 12 (such as via phase modulation or current modulation).

Illustrative processing performed by the processor 88 is explained below. It will be appreciated that, in some embodiments, the illustrative processing described below may also be performed by a suitable field-programmable gate array (FPGA) or a suitable application-specific integrated circuit (ASIC). Therefore, as used herein, the term "processor" is intended to include an FPGA and an ASIC.

By way of overview, an algorithm executed by the processor 88 (sometimes referred to as the "PLL algorithm") calculates the error between the desired phase of the laser 12 and actual phase of the laser 12. In various embodiments and as will be explained below in detail, the processor 88: (1)

multiplies each of the signals 78, 82, and 86 with its respective phase value and sums them (equal to a (conjugate) times b—and referred to as M); (2) determines an ideal value of a and an ideal value of b and multiplies the ideal value of a (conjugate) by the ideal value of b (referred to as $M_{ideal}$); and multiplies M and $M_{ideal}$ (conjugate) to calculate frequency error of the laser 12.

It will be appreciated that ideal frequency chirp profiles can include $$f_{up}(t) = \frac{\beta}{\tau}t + f_0, \text{ and } f_{down}(t) = -\frac{\beta}{\tau}t + f_0,$$

where $\beta$ is the bandwidth of the laser 12, $\tau$ is the up (or down) chirp length, and $f_0$ is the base carrier frequency. The phase of the nominal arm (that is, the non-path-delayed arm 16) is $$\phi(t) = \int f(t)dt = \frac{\beta}{2\tau}t^2,$$

and the phase of the delay arm (that is, the arm 18) is $$\phi(t - \Delta t) = \frac{\beta}{2\tau}(t - \Delta t)^2 = \frac{\beta}{2\tau}t^2 - \frac{\beta}{\tau}t\Delta t + \frac{\beta}{2\tau}(\Delta t)^2$$

where $\Delta t$ is the delay path time.

The complex signals for the arms 16 and 18 (that is, output from the delay line 20), respectively, are $$b = e^{i\phi(t)}, a = e^{i\phi(t-\Delta t)}.$$

The analog electrical beat frequency signals 70, 72, and 74 output from the detectors 30, 32, and 34, respectively, are $$I_1 = |ae^{\phi_1 i} + b|^2 = |a+b|^2, I_2 = |ae^{\phi_2 i} + b|^2, I_3 = |ae^{\phi_3 i} + b|^2$$

where ideally $$\phi_2 = \frac{2\pi}{3} \text{ and } \phi_3 = \frac{4\pi}{3} \text{ relative to } \phi_1 = 0.$$

The processor 88 multiplies each of the signals 78, 82, and 86 with its respective phase value (that is, 1, $$e^{\frac{2\pi}{3}i}, e^{\frac{4\pi}{3}i},$$

respectively) and sums them. This quantity derived from the three measured signals 70, 72, and 74, can be equated with a value M (which includes the phase error). The value M can be directly calculated as $$M = [I_1, I_2, I_3] * \frac{1}{3}\left[1, e^{\frac{2\pi}{3}i}, e^{\frac{4\pi}{3}i}\right]$$

$$= \frac{1}{3}(aa^* + a^*b + ab^* + bb^*) +$$

$$\frac{1}{3}\left(aa^*e^{\frac{2\pi}{3}i} + a^*e^{\left(-\frac{2\pi}{3}+\frac{2\pi}{3}\right)i}b + ae^{\left(\frac{2\pi}{3}+\frac{2\pi}{3}\right)i}b^* + bb^*e^{\frac{2\pi}{3}i}\right) +$$

$$\frac{1}{3}\left(aa^*e^{\frac{4\pi}{3}i} + a^*e^{\left(-\frac{4\pi}{3}+\frac{4\pi}{3}\right)i}b + ae^{\left(\frac{4\pi}{3}+\frac{4\pi}{3}\right)i}b^* + bb^*e^{\frac{4\pi}{3}i}\right)$$

$$= a^*b.$$

Thus, the calculated value M is indicative of measured signals.

Likewise, an ideal signal, $M_{ideal}$, can be calculated as the ideal value of a (conjugate) times b:

$$M_{ideal} = a*b$$

Multiplying M and with the conjugate of the calculated ideal signal $M_{ideal}$ yields the phase error $$M * (a^*b)^*_{ideal} = e^{i\left(\frac{\beta}{\tau}t\Delta t - \frac{\beta}{2\tau}(\Delta t)^2 + \Delta\phi_{err}\right)} e^{-i\left(\frac{\beta}{\tau}t\Delta t - \frac{\beta}{2\tau}(\Delta t)^2\right)} = e^{i\Delta\phi_{err}}.$$

The frequency correction calculated by the PLL algorithm is $$\Delta f_{err} = \frac{\text{angle}(M * (a^*b)^*_{ideal})}{2\pi\Delta t}.$$

It will be appreciated that the digital signal 102 is a digital signal that is indicative of the frequency correction $\Delta f_{err}$. The digital signal 102 is converted to the analog signal 106 with the digital to analog converter 104 and is provided as a feedback signal to the laser 12 to control the laser, such as without limitation by providing for chirp correction, in various ways as desired. In various embodiments the analog signal 106 may be provided to modulate current of the laser 12. In some embodiments in which the laser 12 may include internal phase modulation, the analog signal 106 may be provided to modulate phase of the laser 12. In some embodiments, the analog signal 106 may be provided to an external phase modulator to modulate phase of the laser 12. In some embodiments, the analog signal 106 may modulate the frequency or dispersion characteristics of a device used to provide feedback in the laser cavity. In some embodiments, the analog signal 106 may modulate an internal ring resonator. In some embodiments, the analog signal 106 may modulate length of the laser cavity. In general, it will be appreciated that the analog signal 106 may control any feedback device for the laser 12 as desired.

Further illustrative details of the PLL algorithm are given below by way of illustration only and not of limitation.

It will be appreciated that, in various embodiments, the PLL algorithm entails knowledge of the gain, offset, and phase difference between the detectors 30, 32, and 34. It will also be appreciated that the signals 70, 72, and 74 from the detectors 30, 32, and 34, respectively, when given linear chirp input, can be fitted to a sinusoid to determine the gain, offset, and phase difference between the detectors 30, 32, and 34.

It will also be appreciated that, in various embodiments, the PLL correction can be calculated and used to partially correct the drive signal. In various embodiments, correction can be obtained by deconvolving the response kernel of the laser with the error to determine the ideal pre-compensated signal with which to drive. An illustrative process is described below.

An intensity function used for the fit is given by $$I(t) = \delta + A(1+gt)\cos(\phi(t)),$$

where δ is the detector offset, A is the gain, and gt is the linear response of the laser intensity versus current (current is also linearly proportional to time).

The phase function inside the cosine is $$\phi(t)=2\pi ft+\phi_0+\phi_1 t+\phi_2 t^2+\phi_3 t^3,$$

however only the linear portion of the detector signal is needed to fit I(t).

Measurement of the chirp signal after the drive function convolves with the laser transfer function can be made using the PLL detectors 30, 32, and 34 (with the correction feedback loop turned off). Ideally, the measurements should be as close the ideal ramp/truth as possible:

$$T=D_f \otimes P.$$

In Fourier space, this becomes $$F(T)=F(D)*F(P)$$

where $D_f$=final drive, T=truth (ideal ramp), and P=response of the laser to a drive signal (transfer function).

If an RC filter response (known impulse response) is assumed, then D can be calculated directly with an inverse Fourier (IF):

$$D_f = IF\left(\frac{F(T)*F(P)^*}{|F(P)|^2 + \epsilon \overline{|F(P)|^2}}\right)$$

Further, $M = D_i \otimes P$.

In Fourier space, $$F(P) = \frac{F(M)}{F(D_i)}$$

where M=f, $D_i$=initial drive, P=PSF of the response

When the impulse response (P) is not known, measurements will first have to be obtained based on some initial drive function.

The two equations are solved in in Fourier space:

$$F(T) = F(D_f)*F(P) = F(D_f)*\frac{F(M)}{F(D_i)} \rightarrow F(D_f) = \frac{F(T)*F(D_i)}{F(M)}$$

$$D_f = IF\left(\frac{F(T)*F(D_i)*F(M)^*}{|F(M)|^2 + \epsilon \overline{|F(M)|^2}}\right)$$

The PLL 10 outputs the measured/actual frequency profile that has been generated by the input drive frequency profile. The truth is the ideal chirp profile that is intended to be achieved. A new drive frequency profile is calculated using the deconvolution method discussed above. The difference between the original input drive and the new calculated drive is the correction.

As discussed above, in various embodiments the laser drive profile can be corrected using a deconvolution method based on the measured phase error. The PLL 10 outputs the measured/actual frequency profile that has been generated by the input drive frequency profile. This measured/actual frequency profile can be compared to the ideal chirp profile that is intended to be achieved (truth signal), and the difference between the original input drive and the new calculated drive is the correction. A demonstration was based on a 5-GHz chirp over a 10-microsecond duration with a 1-meter fiber delay line. The reference beat tone is $$\text{Beat tone} = \frac{5\,\text{GHz}}{10\,\mu s} * \frac{1\,\text{meter}}{c} 1.45 = 2.42\,\text{MHz}.$$

Figure 8A:
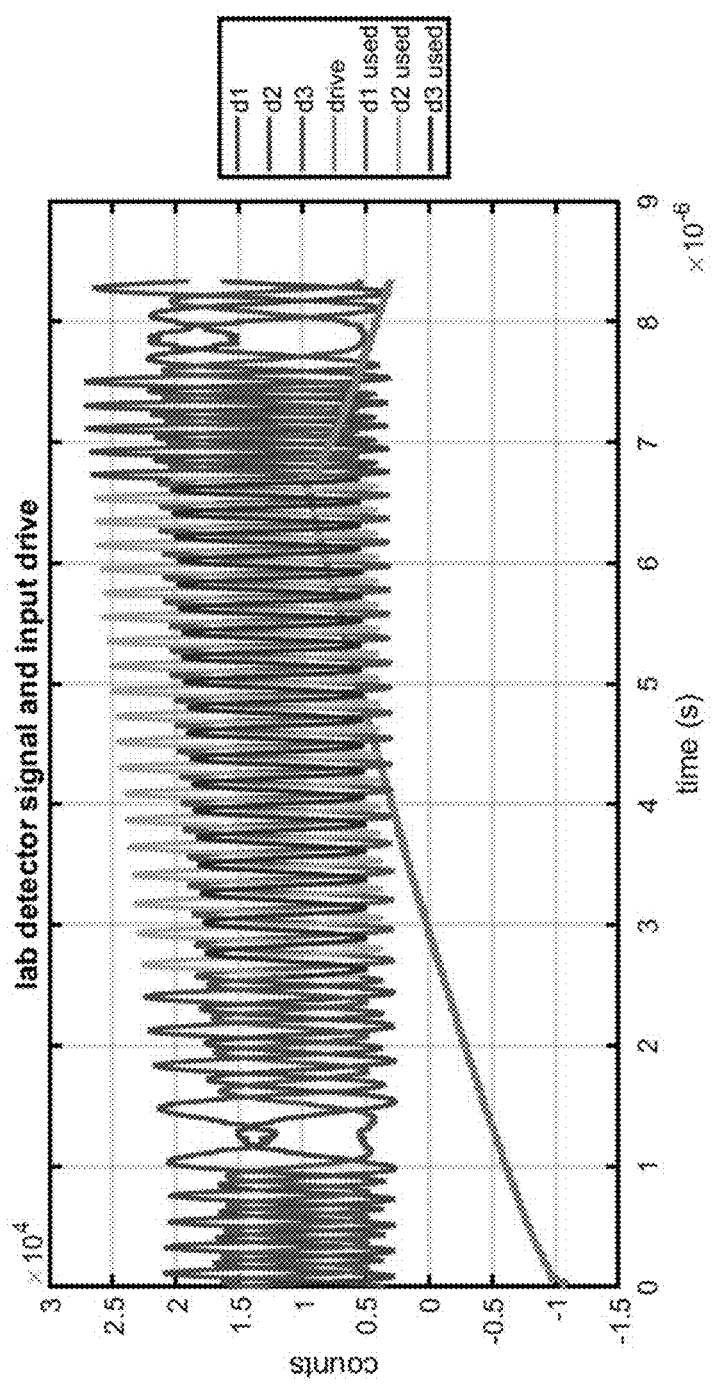
FIGS. 8A and 8B illustrate measured modulation for detectors in a linear laser ramp.
Figure 8B:
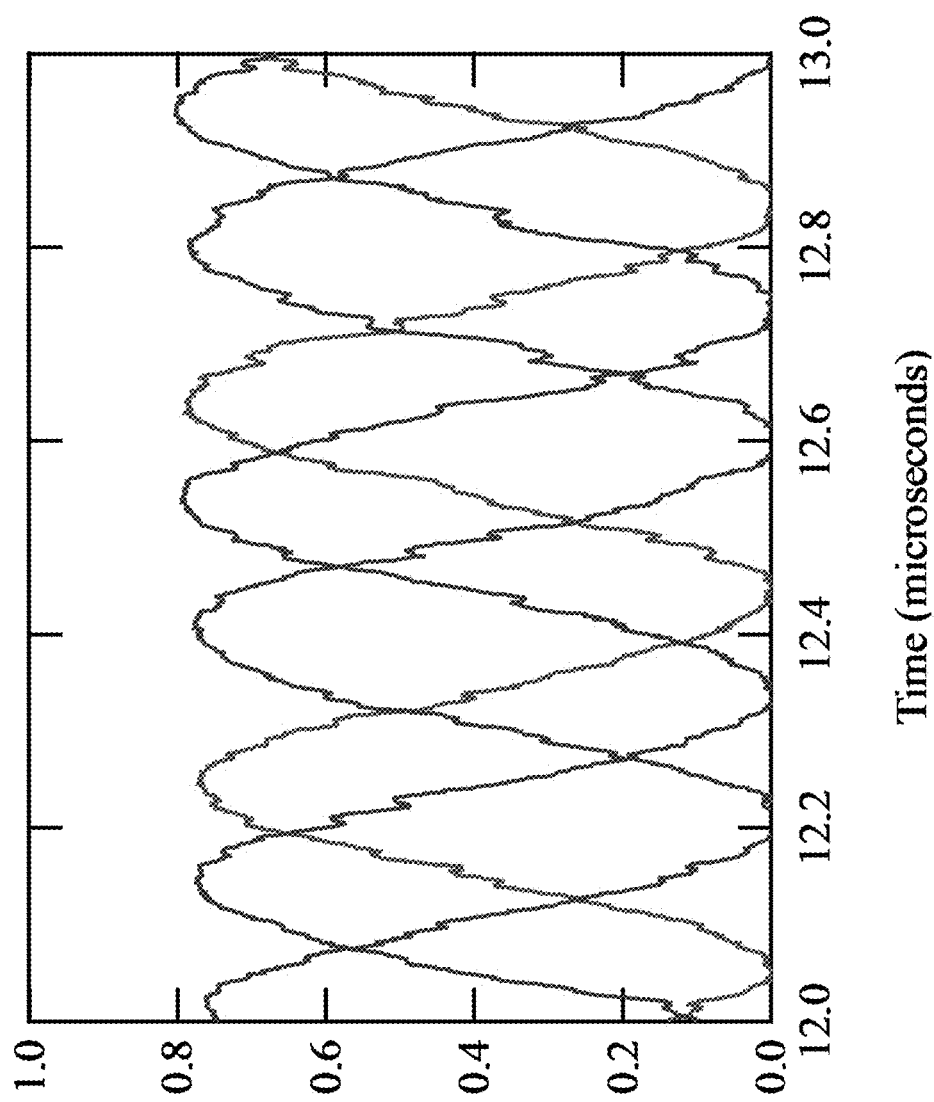

As shown in FIGS. 8A and 8B, in an illustrative implementation given by way of non-limiting example a triangular current ramp may be applied to a laser diode to generate a chirp signal of approximately 5 GHz. Given by way of illustration only and not of limitation, in this illustrative the delay line is constructed with a 1-meter fiber patch-cord, thereby resulting in a 5 ns delay.

Figure 9:
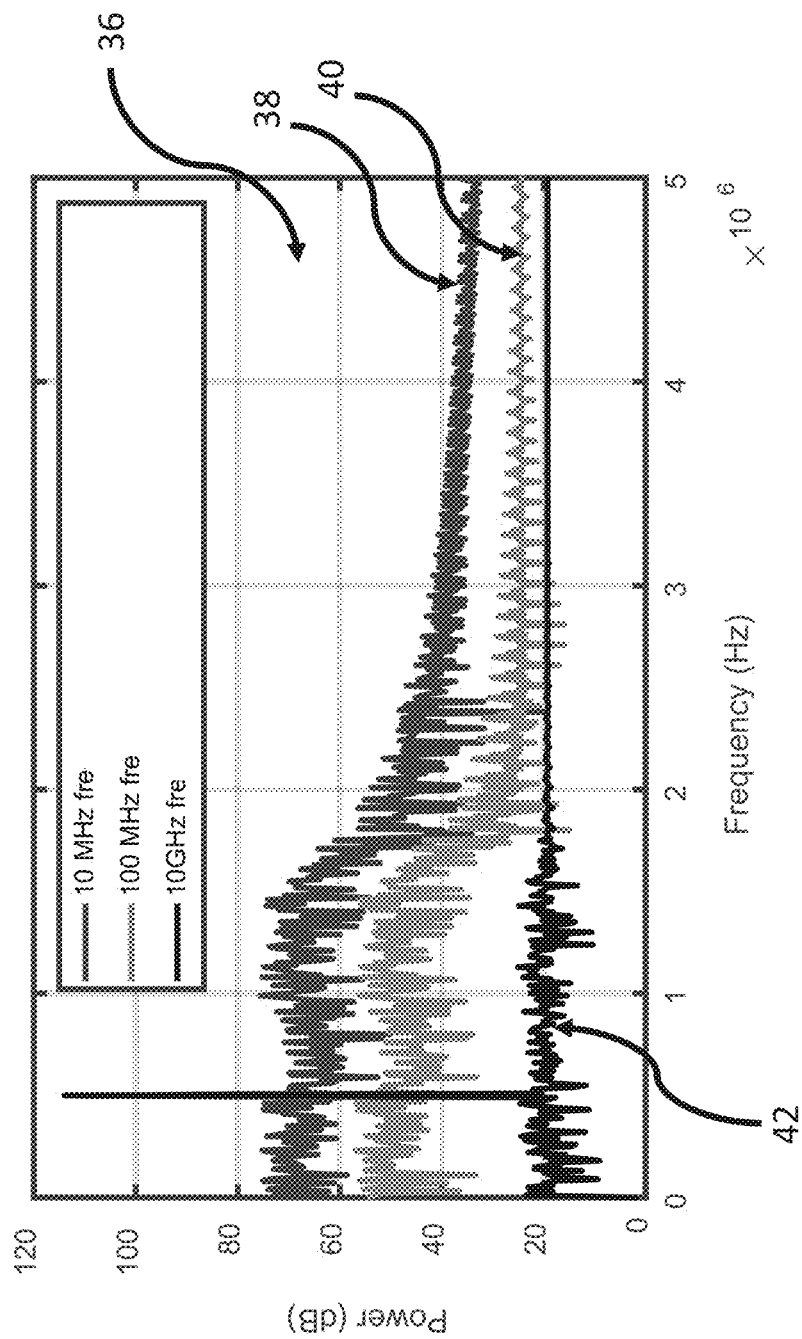
FIG. 9 is an illustration of illustrative PLL simulated performance using a 3-phase measurement.
Figure 10:
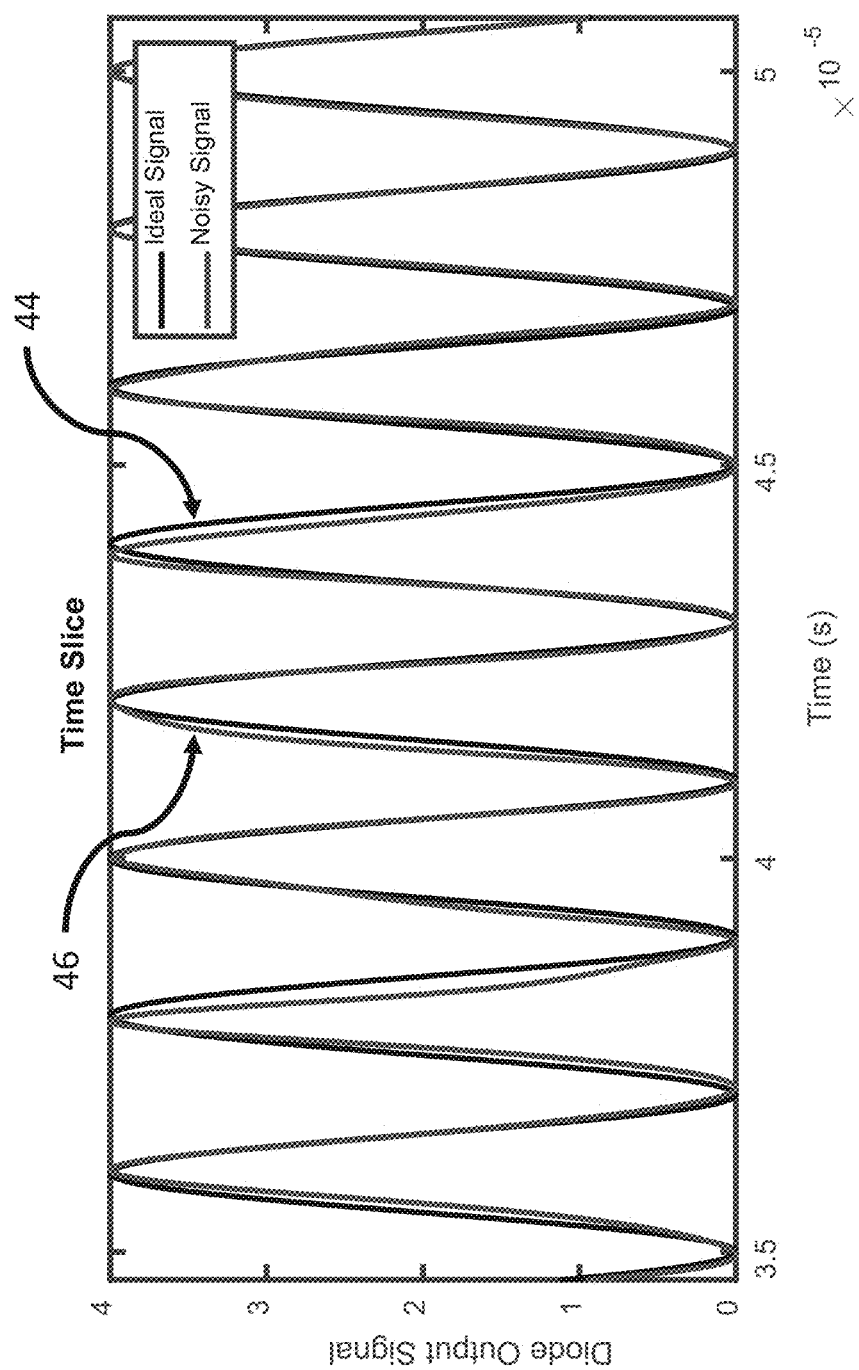
FIG. 10 is an illustration of a time domain signal from $R_{X1}$ for an ideal and noisy signal.

This particular design is simulated below for various digitization rates (or frequency tuning speeds) as well as a continuous analog correction. Referring additionally to FIGS. 9 and 10, 40 dB, 60 dB, and 90 dB of isolation are shown for digitization rates (or frequency tuning speeds) of 10 MHz, 100 MHz, and continuous analog correction (simulated at a frequency tuning speed of 10 GHz). As shown in FIG. 9, a graph 36 plots PLL simulated performance using a 3-phase measurement for digitization rates (or frequency tuning speeds) of 10 MHz, 100 MHz, and continuous analog correction (simulated at a frequency tuning speed of 10 GHz) on curves 38, 40, and 42, respectively. As shown in FIG. 10, an ideal signal 44 and a noisy signal 46 (both shown in time domain) from the laser 12 are used in the simulations.

Figure 11:
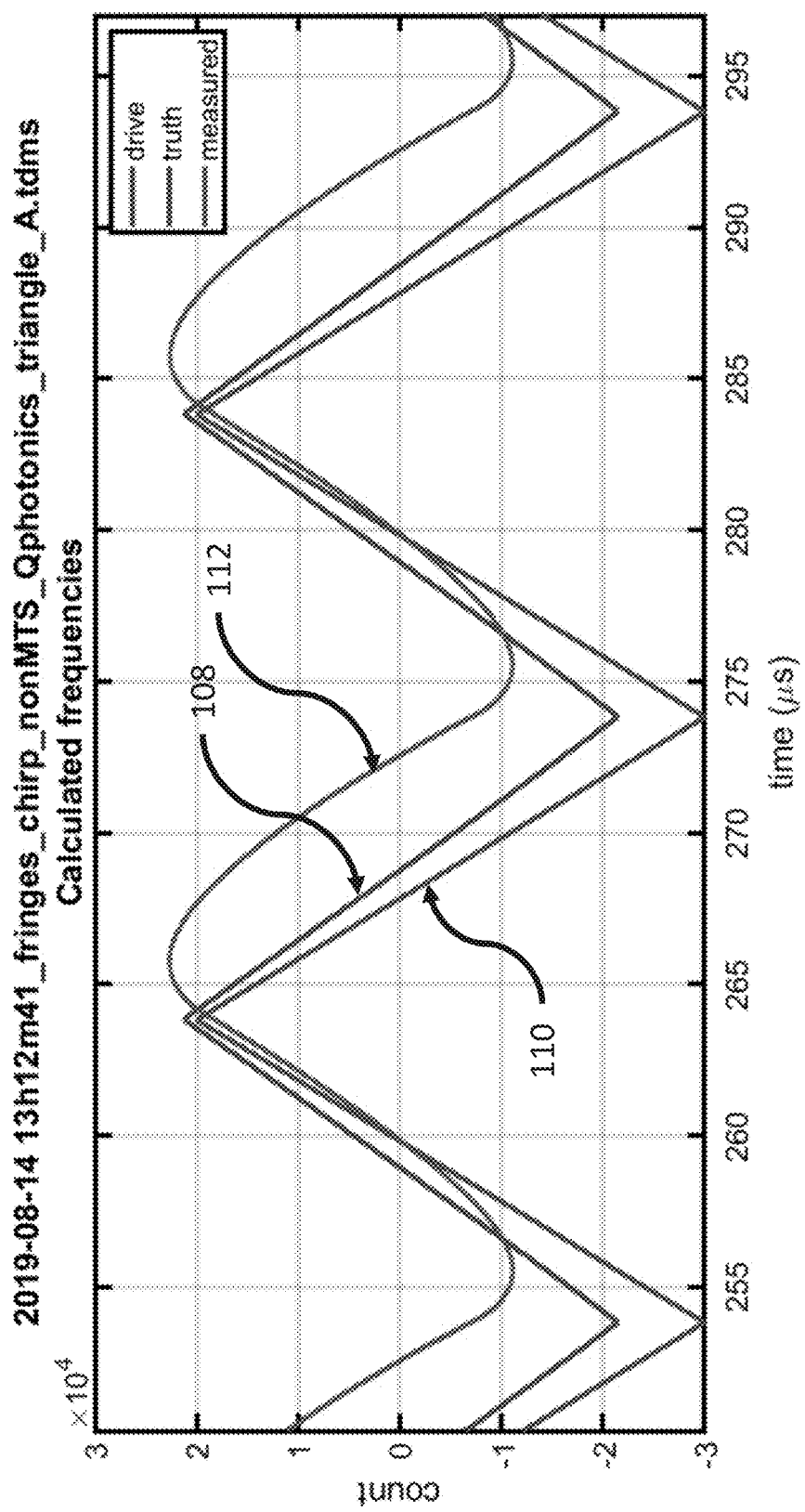
FIG. 11 illustrates an initial laser chirp profile.
Figure 12:
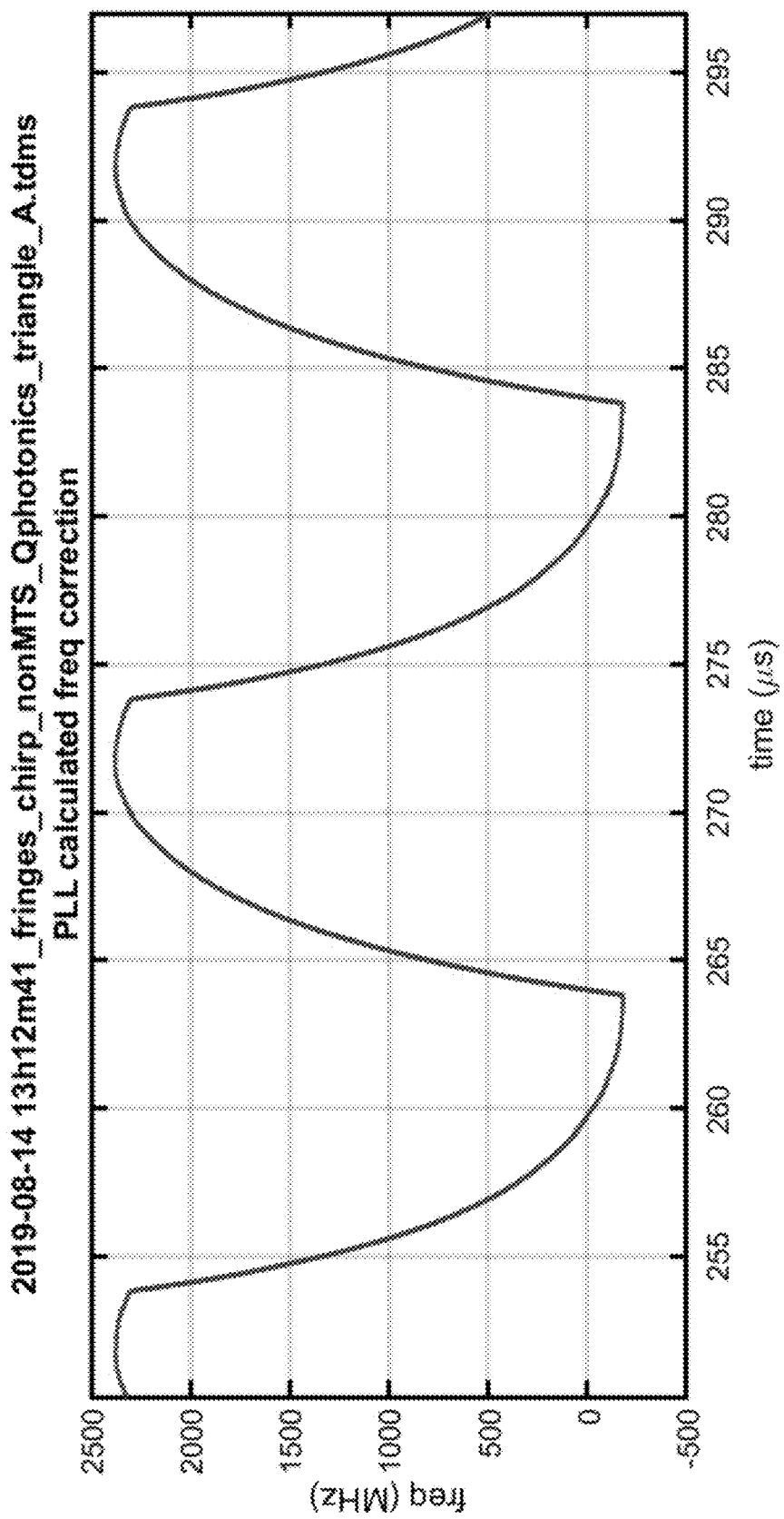
FIG. 12 illustrates an initial calculated frequency correction.
Figure 13:
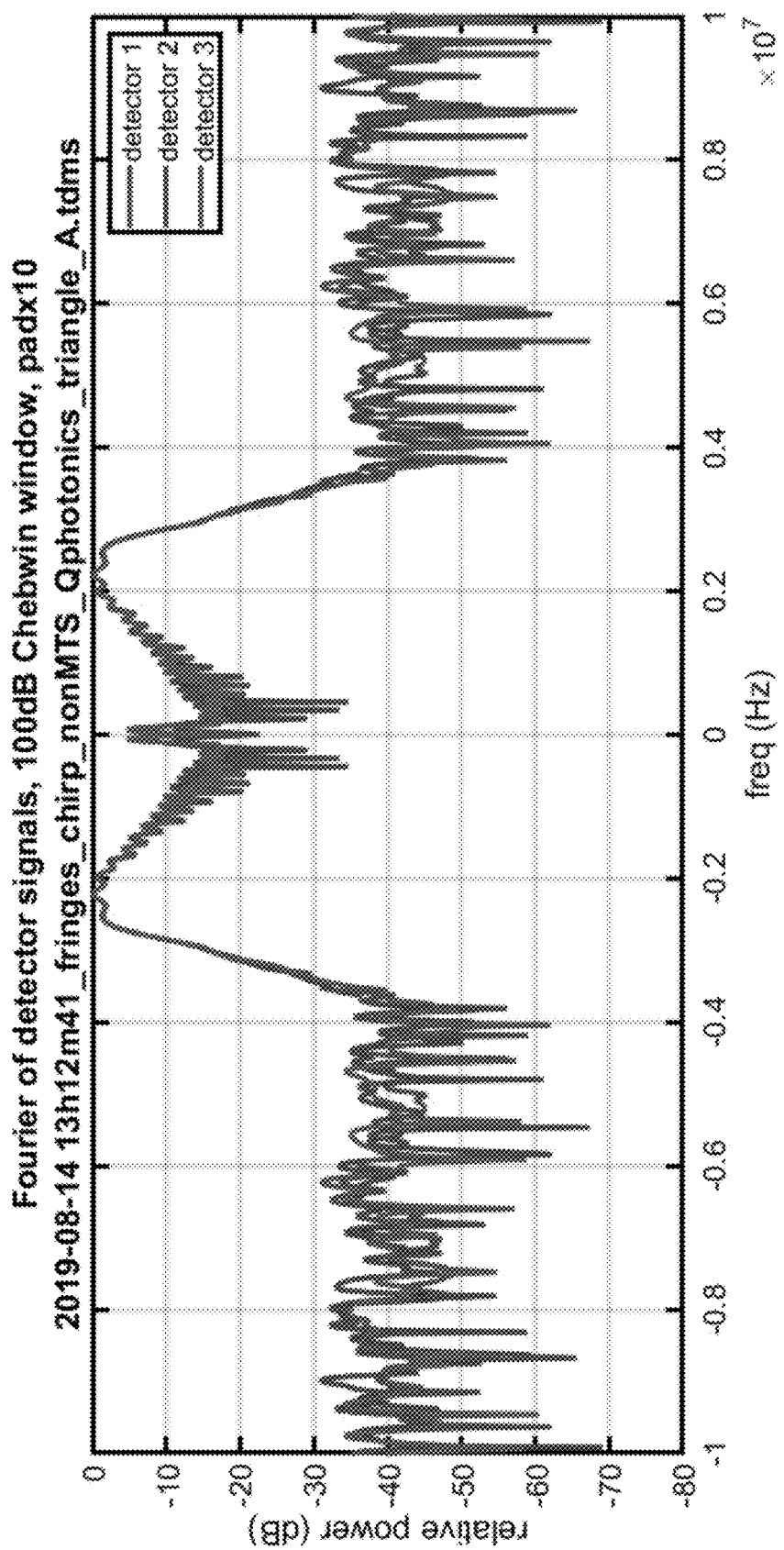
FIG. 13 is a spectral analysis of a chirp signal.

Referring additionally to FIG. 11, an initial laser current drive profile 108, an expected truth signal 110, and a PLL measured phase profile 112 are shown. Referring additionally to FIG. 12, calculated fully integrated error from the PLL measurement shows 2.5 GHz of deviation over 10 microseconds. Referring additionally to FIG. 13, spectral bandwidth of the beat tone is shown—with a noise profile (that is, nonlinearity in the chirp) that extends to approximately 4 MHz over the 5 ns delay.

Figure 14:
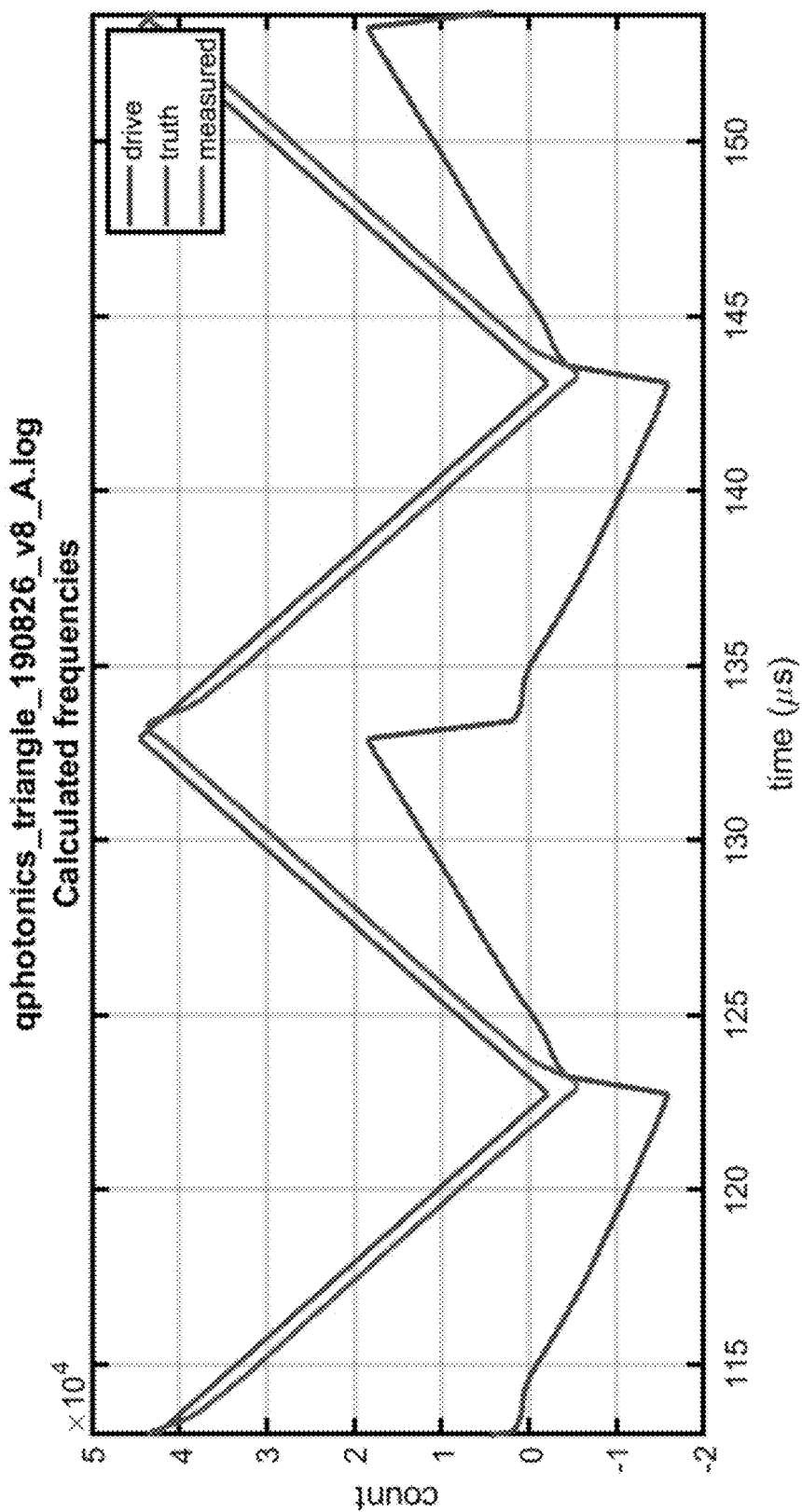
FIG. 14 is a corrected laser chirp profile.
Figure 15:
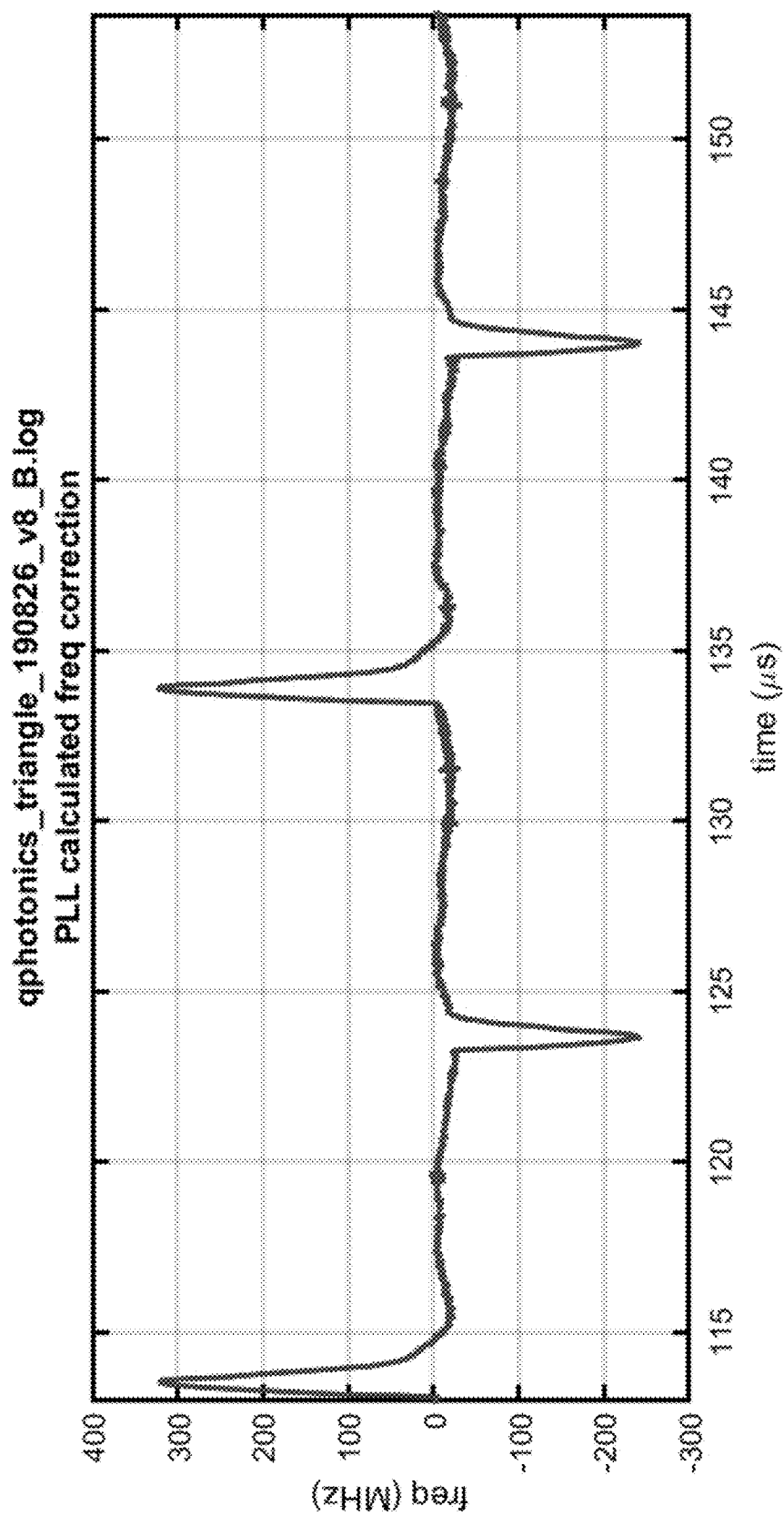
FIG. 15 is a residual frequency error.
Figure 16:
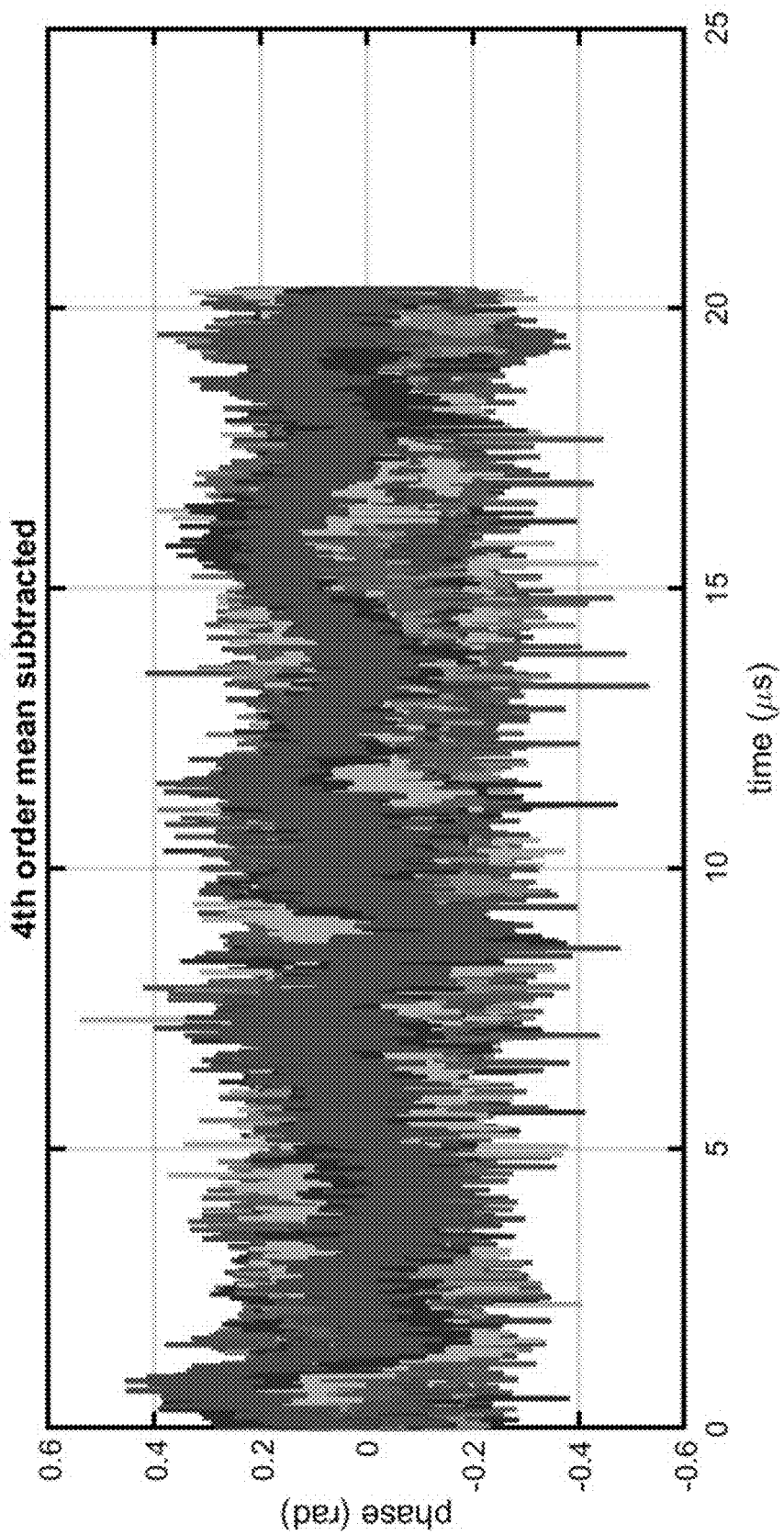
FIG. 16 is a residual phase error.
Figure 17:
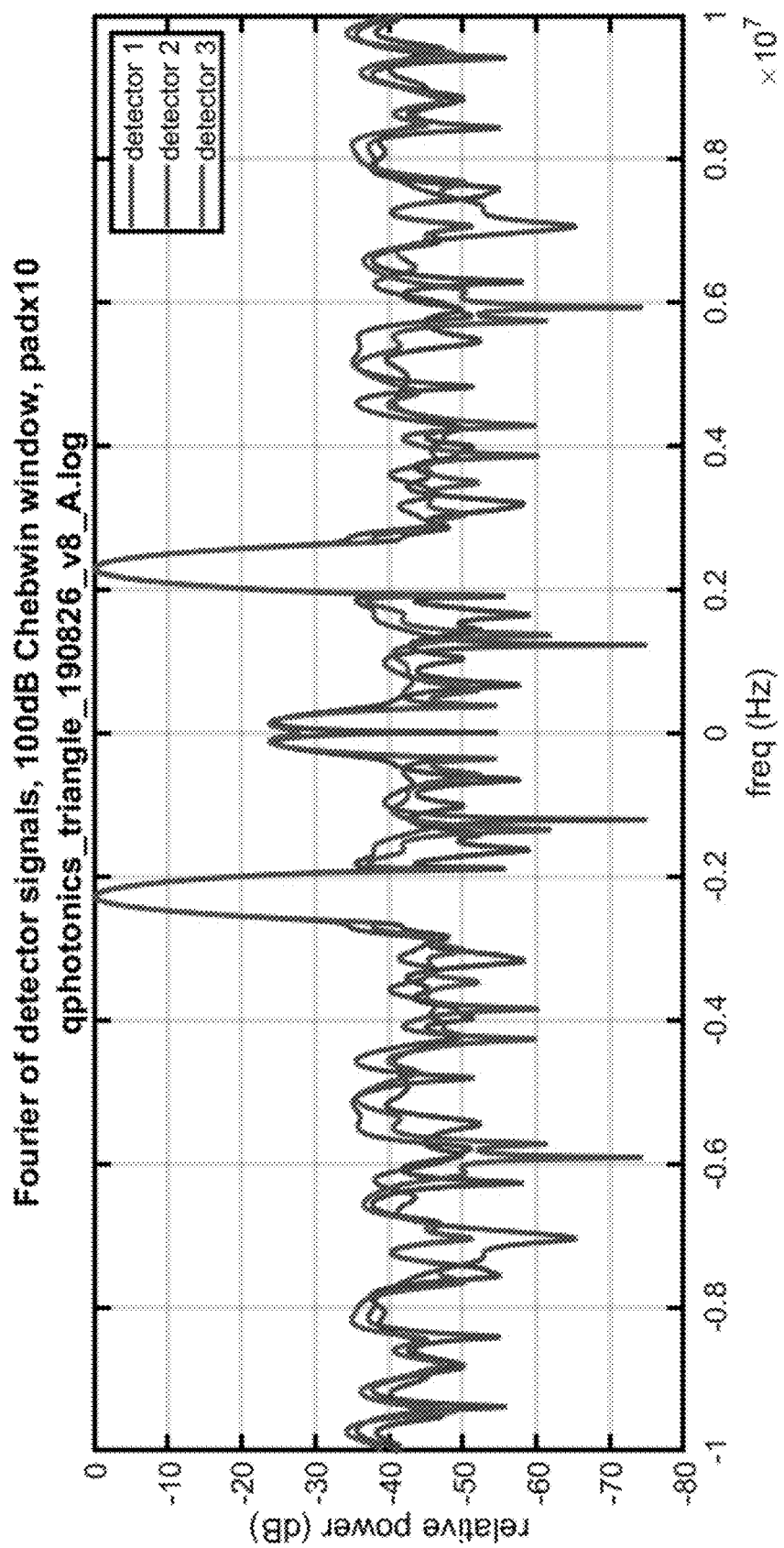
FIG. 17 is a spectral analysis.

Referring additionally to FIGS. 14, 15, 16, and 17, after correction a chirp profile (as shown in FIG. 14) is obtained with a residual frequency error (as shown in FIG. 15) and a residual phase error (as shown in FIG. 16). As shown in FIG. 17, chirp nonlinearity over a 5 ns delay may be reduced to approximately 0.3 MHz.

In some instances, one or more components may be referred to herein as "configured to," "configured by," "configurable to," "operable/operative to," "adapted/adaptable," "able to," "conformable/conformed to," etc. Those skilled in the art will recognize that such terms (for example "configured to") generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (for example, "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (for example, the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software (e.g., a high-level computer program serving as a hardware specification), firmware, or virtually any combination thereof, limited to patentable subject matter under 35 U.S.C. 101. In an embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, limited to patentable subject matter under 35 U.S.C. 101, and that designing the circuitry and/or writing the code for the software (e.g., a high-level computer program serving as a hardware specification) and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

With respect to the appended claims, those skilled in the art will appreciate that recited operations therein may generally be performed in any order. Also, although various operational flows are presented in a sequence(s), it should be understood that the various operations may be performed in other orders than those which are illustrated or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An optical phase locked loop comprising:
a first optical splitter configured to split light from a laser into a first arm and a second arm;
a delay line configured to time delay light in an arm chosen from the first arm and the second arm;
a second optical splitter configured to split the light in the first arm into third, fourth, and fifth arms;
a third optical splitter configured to split the light in the second arm into sixth, seventh, and eighth arms;
a first phase shifter configured to phase shift light in the seventh arm relative to light in the sixth arm;
a second phase shifter configured to phase shift light in the eighth arm relative to light in the sixth arm;
a first combiner configured to combine light in the third arm with light in the sixth arm;
a second combiner configured to combine light in the fourth arm with phase shifted light in the seventh arm;
a third combiner configured to combine light in the fifth arm with phase shifted light in the eighth arm;
a first detector configured to detect a first analog electrical signal from light from the first combiner;
a second detector configured to detect a second analog electrical signal from light from the second combiner;
a third detector configured to detect a third analog electrical signal from light from the first combiner; and a processor configured to generate a frequency correction signal for the laser responsive to the first, second, and third analog electrical signals.

2. The phase locked loop of claim 1, wherein the delay line is configured to delay light in a time range from around 100 picoseconds to around 1 nanosecond.

3. The phase locked loop of claim 2, wherein the delay line is configured to delay light by around 600 picoseconds.

4. The phase locked loop of claim 1, wherein:
the first phase shifter is further configured to phase shift light in the seventh arm by a $2\pi/3$ phase shift relative to light in the sixth arm; and
the second phase shifter is further configured to phase shift light in the eighth arm by a $4\pi/3$ phase shift relative to light in the sixth arm.

5. The phase locked loop of claim 1, further comprising:
a first analog to digital converter configured to convert the first analog electrical signal to a first digital signal;
a second analog to digital converter configured to convert the second analog electrical signal to a second digital signal; and
a third analog to digital converter configured to convert the third analog electrical signal to a third digital signal.

6. The phase locked loop of claim 5, wherein the processor is further configured to:
multiply the second digital signal with phase shift of the seventh arm; and
multiply the third digital signal with phase shift of the eighth arm.

7. The phase locked loop of claim 6, wherein the processor is further configured to sum the first digital signal, a multiplicand of the second digital signal with the phase shift of the seventh arm, and a multiplicand of the third digital signal with the phase shift of the eighth arm.

8. The phase locked loop of claim 7, wherein the sum of the first digital signal, a multiplicand of the second digital signal with the phase shift of the seventh arm, and a multiplicand of the third digital signal with the phase shift of the eighth arm is indicative of a measured phase of the laser.

9. The phase locked loop of claim 8, wherein the processor is further configured to determine a desired phase of the laser.

10. The phase locked loop of claim 9, wherein the processor is further configured to determine a phase error of the laser responsive to the measured phase of the laser and the desired phase of the laser.

11. The phase locked loop of claim 10, wherein the processor is further configured to determine a frequency correction for the laser responsive to the phase error of the laser.

12. The phase locked loop of claim 11, wherein the processor is further configured to generate the frequency correction signal for the laser responsive to the determined frequency correction for the laser responsive to the phase error of the laser.

13. The phase locked loop of claim 1, wherein the frequency correction signal is configured to modulate laser current.

14. The phase locked loop of claim 1, wherein the frequency correction signal is configured to modulate a phase modulator of the laser.

15. A laser system comprising:
a laser;
a power tap configured to split light from the laser into an output arm and a lock arm; and
a phase locked loop including:
a first optical splitter configured to split light from the lock arm into a first arm and a second arm;
a delay line configured to time delay light in an arm chosen from the first arm and the second arm;
a second optical splitter configured to split the light in the first arm into third, fourth, and fifth arms;
a third optical splitter configured to split the light in the second arm into sixth, seventh, and eighth arms;
a first phase shifter configured to phase shift light in the seventh arm relative to light in the sixth arm;
a second phase shifter configured to phase shift light in the eighth arm relative to light in the sixth arm;
a first combiner configured to combine light in the third arm with light in the sixth arm;
a second combiner configured to combine light in the fourth arm with phase shifted light in the seventh arm;
a third combiner configured to combine light in the fifth arm with phase shifted light in the eighth arm;
a first detector configured to detect a first analog electrical signal from light from the first combiner;
a second detector configured to detect a second analog electrical signal from light from the second combiner;
a third detector configured to detect a third analog electrical signal from light from the first combiner; and
a processor configured to generate a frequency correction signal for the laser responsive to the first, second, and third analog electrical signals.

16. The laser system of claim 15, wherein light from the laser has a wavelength in a 1.5 micron telecommunication band.

17. The laser system of claim 15, wherein light from the laser has a power level between 1 mW and 500 mW.

18. The laser system of claim 15, wherein the delay line is configured to delay light in a time range from around 100 picoseconds to around 1 nanosecond.

19. The laser system of claim 18, wherein the delay line is configured to delay light by around 600 picoseconds.

20. The laser system of claim 15, wherein:
the first phase shifter is further configured to phase shift light in the seventh arm by a $2\pi/3$ phase shift relative to light in the sixth arm; and
the second phase shifter is further configured to phase shift light in the eighth arm by a $4\pi/3$ phase shift relative to light in the sixth arm.

21. The laser system of claim 15, further comprising:
a first analog to digital converter configured to convert the first analog electrical signal to a first digital signal;
a second analog to digital converter configured to convert the second analog electrical signal to a second digital signal; and
a third analog to digital converter configured to convert the third analog electrical signal to a third digital signal.

22. The laser system of claim 21, wherein the processor is further configured to:
multiply the second digital signal with phase shift of the seventh arm; and
multiply the third digital signal with phase shift of the eighth arm.

23. The laser system of claim 22 wherein the processor is further configured to sum the first digital signal, a multiplicand of the second digital signal with the phase shift of the seventh arm, and a multiplicand of the third digital signal with the phase shift of the eighth arm.

24. The laser system of claim 23, wherein the sum of the first digital signal, a multiplicand of the second digital signal with the phase shift of the seventh arm, and a multiplicand of the third digital signal with the phase shift of the eighth arm is indicative of a measured phase of the laser.

25. The laser system of claim 24, wherein the processor is further configured to determine a desired phase of the laser.

26. The laser system of claim 25, wherein the processor is further configured to determine a phase error of the laser responsive to the measured phase of the laser and the desired phase of the laser.

27. The laser system of claim 26, wherein the processor is further configured to determine a frequency correction for the laser responsive to the phase error of the laser.

28. The laser system of claim 27, wherein the processor is further configured to generate the frequency correction signal for the laser responsive to the determined frequency correction for the laser responsive to the phase error of the laser.

29. The laser system of claim 15, wherein the frequency correction signal is configured to modulate laser current.

30. The laser system of claim 15, wherein the frequency correction signal is configured to modulate a phase modulator of the laser.

31. A phase locked loop method comprising:
splitting light from a laser into a first arm and a second arm;
time delaying light in an arm chosen from the first arm and the second arm;
splitting the light in the first arm into third, fourth, and fifth arms;
splitting the light in the second arm into sixth, seventh, and eighth arms;
phase shifting light in the seventh and eighth arms relative to light in the sixth arm;
combining light in the third, fourth, and fifth arms with light in the sixth arm and phase shifted light in the seventh and eighth arms, respectively; and
generating a frequency correction signal for the laser.

32. The method of claim 31, wherein generating a frequency correction signal for the laser includes:
detecting a first analog electrical signal from combining the light in the third arm with light in the sixth arm;
detecting a second analog electrical signal from combining the light in the fourth arm with phase-shifted light in the seventh arm; and
detecting a third analog electrical signal from combining the light in the fifth arm with phase-shifted light in the eighth arm.

33. The method of claim 32, wherein generating a frequency correction signal for the laser further includes:
converting the first analog electrical signal to a first digital signal;
converting the second analog electrical signal to a second digital signal; and
converting the third analog electrical signal to a third digital signal.

34. The method of claim 33, wherein generating a frequency correction signal for the laser further includes:
multiplying the second digital signal with phase shift of the seventh arm; and
multiplying the third digital signal with phase shift of the eighth arm.

35. The method of claim 34, wherein generating a frequency correction signal for the laser further includes:
summing the first digital signal, a multiplicand of the second digital signal with the phase shift of the seventh arm, and a multiplicand of the third digital signal with the phase shift of the eighth arm.

36. The method of claim 35, wherein summing the first digital signal, a multiplicand of the second digital signal with the phase shift of the seventh arm, and a multiplicand of the third digital signal with the phase shift of the eighth arm is indicative of a measured phase of the laser.

37. The method of claim 36, further comprising determining a desired phase of the laser.

38. The method of claim 37, further comprising determining a phase error of the laser responsive to the measured phase of the laser and the desired phase of the laser.

39. The method of claim 38, further comprising determining a frequency correction for the laser responsive to the phase error of the laser.

40. The method of claim 39, wherein generating a frequency correction signal for the laser is responsive to determining a frequency correction for the laser responsive to the phase error of the laser.

41. The method of claim 31, further comprising providing the frequency correction signal to the laser.

42. The method of claim 41, further comprising modulating laser current.

43. The method of claim 41, further comprising modulating a phase modulator of the laser.

* * * * *